United States Patent
Mieno et al.

(10) Patent No.: US 9,478,654 B2
(45) Date of Patent: Oct. 25, 2016

(54) METHOD FOR MANUFACTURING SEMICONDUCTOR DEVICE WITH TENSILE STRESS

(75) Inventors: Fumitake Mieno, Beijing (CN); Meisheng Zhou, Beijing (CN)

(73) Assignee: SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 13/369,782

(22) Filed: Feb. 9, 2012

(65) Prior Publication Data

US 2013/0140576 A1 Jun. 6, 2013

(30) Foreign Application Priority Data

Dec. 5, 2011 (CN) .......................... 2011 1 0398750

(51) Int. Cl.
*H01L 21/336* (2006.01)
*H01L 29/78* (2006.01)
*H01L 29/66* (2006.01)
*H01L 29/10* (2006.01)

(52) U.S. Cl.
CPC ........... *H01L 29/78* (2013.01); *H01L 29/1083* (2013.01); *H01L 29/66636* (2013.01)

(58) Field of Classification Search
CPC ..................................................... H01L 29/78
USPC .................... 257/190; 438/301, 478, 300
See application file for complete search history.

(56) References Cited

U.S. PATENT DOCUMENTS

| | | | | |
|---|---|---|---|---|
| 5,620,912 A * | 4/1997 | Hwang | ............... | H01L 29/0653 257/E21.431 |
| 6,071,783 A * | 6/2000 | Liang | .................. | H01L 29/0653 257/E21.431 |
| 6,294,817 B1 * | 9/2001 | Srinivasan | ........ | H01L 29/66636 257/347 |
| 6,403,482 B1 * | 6/2002 | Rovedo | ............... | H01L 29/0653 257/E21.431 |
| 2002/0061631 A1 * | 5/2002 | Miyabayashi | .... | H01L 21/76259 438/478 |
| 2003/0034521 A1 * | 2/2003 | Lee | ..................... | H01L 29/0653 257/344 |
| 2005/0227479 A1 * | 10/2005 | Feng | ................... | H01L 21/2885 438/637 |
| 2005/0280052 A1 * | 12/2005 | Holz | ................... | H01L 29/0653 257/288 |
| 2006/0131657 A1 * | 6/2006 | Hamaguchi | ..... | H01L 21/823814 257/369 |
| 2006/0134873 A1 * | 6/2006 | Koontz | .......... | H01L 21/823807 438/301 |
| 2008/0206965 A1 * | 8/2008 | Gluschenkov | .... | H01L 21/02529 438/478 |
| 2009/0302348 A1 * | 12/2009 | Adam | ............... | H01L 21/26513 257/190 |

FOREIGN PATENT DOCUMENTS

CN 101740460 6/2010

OTHER PUBLICATIONS

Office Action from corresponding Chinese Patent Appl. No. 201110398750.5, dated Dec. 26, 2014.
Office Action from corresponding Chinese Patent Appl. No. 201110398750.5, dated Jul. 14, 2015.

* cited by examiner

*Primary Examiner* — John C Ingham
*Assistant Examiner* — Ismail Muse
(74) *Attorney, Agent, or Firm* — Koppel, Patrick, Heybl & Philpott

(57) ABSTRACT

A semiconductor device, and a method for manufacturing the same, comprises a source/drain region formed using a solid phase epitaxy (SPE) process to provide partially isolated source/drain transistors. Amorphous semiconductor material at the source/drain region is crystallized and then shrunk through annealing, to apply tensile stress in the channel direction.

16 Claims, 3 Drawing Sheets

METHOD FOR MANUFACTURING SEMICONDUCTOR DEVICE WITH TENSILE STRESS

CROSS-REFERENCE TO RELATED APPLICATIONS

This application claims priority to Chinese Patent Application No. 201110398750.5, filed on Dec. 5, 2011 and entitled "SEMICONDUCTOR DEVICE AND METHOD FOR MANUFACTURING THE SAME", which is incorporated herein in its entirety by reference.

BACKGROUND OF THE INVENTION

1. Field of the Invention

The present invention relates to semiconductors and more particularly, to a semiconductor device and method for manufacturing the same.

2. Description of the Related Art

The improvement of performance of a semiconductor device has become a persistent demand in the field of semiconductors and integrated circuits. As the scaling of the semiconductor device and integrated circuit (IC) has become increasingly difficult, methods capable of improving semiconductor device performance without scaling of the semiconductor device have attracted attentions and concerns.

For example, in one method, a strained silicon technique is employed to apply stress in a semiconductor layer of a semiconductor device such as a transistor, so as to improve carrier mobility and thereby the semiconductor device performance. Generally, the above strained silicon technique may be implemented through SiGe epitaxy, Si—C epitaxy, and the like.

Application of localized source/drain isolation (also referred to as partially isolated semiconductors) transistors has been proposed. Such transistors are advantageous for suppressing the parasitic capacitance of a source/drain junction, reducing source and drain leakage current, etc.

For example, FIG. 1 shows a schematic structural diagram of a prior art localized source/drain isolated transistor 10.

As shown in FIG. 1, the transistor 10 comprises a semiconductor substrate 100 comprising, for example Si, a source/drain region 120 in the semiconductor substrate 100, a gate insulating film 130 on a channel region 115 of the semiconductor substrate 100, and a gate electrode 140 on the gate insulating film 130. In addition, the transistor 10 may further comprise a gate spacer 150, such as a nitride, around the gate electrode 140.

The source/drain region 120 is formed for example, from polycrystalline silicon. An isolation layer 110 is disposed below the source/drain region 120 and on a portion of a side of the source/drain region 120 interfacing with the channel region 115. The isolation layer 110 may be for example, silicon oxide. As shown in the figure, no isolation layer 110 is disposed at the portion of the side of the source/drain region 120 adjacent to the surface 105 of the semiconductor substrate 100. In this example, the source/drain region 120 is partially isolated from the semiconductor substrate 100 by the isolation layer 110, and is electrically connected to the channel region 115, thus forming a partially isolated source/drain region.

However, in such partially isolated source/drain devices, it is difficult to employ the existing strained silicon technique, since the source/drain region 120 is isolated by the isolation layer 110. For instance, in the case of source/drain region formed by polycrystalline silicon, it is difficult to produce stress in the channel direction through SiGe epitaxy and Si—C epitaxy, especially with a raised source/drain region.

Therefore, there is a continuing demand for an improved semiconductor device and method for manufacturing the same in the field of semiconductor devices.

SUMMARY OF THE INVENTION

One object of this invention is to at least address some or all of the above problems in the prior art.

According to one aspect of the present invention, there is provided a method of manufacturing semiconductor devices. The method may comprise: etching a semiconductor substrate to form a recess for a source/drain region; forming an isolation layer on a surface of the recess, wherein a portion of a side surface of the recess adjacent to the surface of the semiconductor substrate is exposed; filling the recess with an amorphous semiconductor material and annealing the amorphous semiconductor material to form the source/drain region.

Optionally, the above method may further comprise before forming the recess, forming a gate insulating film on the surface of the semiconductor substrate and forming a gate electrode on the gate insulating film.

Preferably, in the above method, the step of forming the isolation layer may comprise forming through oxidation an oxide layer as the isolation layer on the surface of the recess, and etching the oxide layer to expose the portion of the side surface of the recess adjacent to the surface of the semiconductor substrate.

Preferably, in the above method, the step of filling the recess with an amorphous semiconductor material may comprise depositing an amorphous semiconductor material on the semiconductor substrate and selectively removing the amorphous semiconductor material such that only the amorphous semiconductor material in the recess remains.

Preferably, in the above method, the step of selectively removing the amorphous semiconductor material may comprise planarizing the deposited amorphous semiconductor material and etching back the amorphous semiconductor material.

Preferably, in the above method, the planarizing may comprise chemical mechanical polishing (CMP).

Preferably, in the above method, the amorphous semiconductor material may comprise amorphous Si.

Preferably, in the above method, the amorphous semiconductor material may comprise amorphous SiC. Preferably, the amorphous SiC may contain 1-4% volume carbon.

Preferably, in the above method, the annealing may be performed in a $N_2$ or He atmosphere at 600-750° C. for 2-36 hours.

Preferably, in the above method, the annealing may be performed in a $N_2$ or He atmosphere at 650° C. for 24 hours.

Preferably, in the above method, before filling the recess with the amorphous semiconductor material, a surface plasma treatment is performed on the semiconductor substrate.

Preferably, in the above method, the surface plasma treatment may be a hydrogen plasma treatment performed with an Rf power of 200 W under a pressure of 2 Torrs at room temperature for 1-3 mins.

Preferably, in the above method, before filling the recess with the amorphous semiconductor material, a surface annealing treatment is performed on the semiconductor substrate.

Preferably, in the above method, the surface annealing treatment may be hydrogen annealing performed in H₂ atmosphere with a flow rate of 20-200 SLM, under a pressure of 30-760 Torrs and at a temperature of 800° C. for 1-3 mins.

Preferably, in the above method, the semiconductor device is an nMOS transistor.

Preferably, in the above method, the semiconductor substrate may be a Si substrate, and the isolation layer may be a layer of silicon oxide, silicon nitride, silicon oxynitride or silicon nitride oxide.

According to another aspect of this invention, there is provided a semiconductor device. The semiconductor device may comprise a source/drain region located in a semiconductor substrate keeping an isolation layer located below the source/drain region and at a side of the source/drain region interfacing with a channel region. However, while the isolation layer is not disposed on a portion of the side adjacent to a surface of the semiconductor substrate. The source/drain region is formed by annealing an amorphous semiconductor material, thereby applying tensile stress to the semiconductor device in a channel direction.

Preferably, the above semiconductor device is an nMOS transistor.

According to a method of this invention, for partially isolated source/drain transistors, instead of applying a polycrystalline semiconductor such as polycrystalline silicon to the source/drain region, the source/drain region is formed through a solid phase epitaxy (SPE) process. Therefore, as compared to the conventional strained silicon technique (such as, SiGe epitaxy or SiC epitaxy), it can be applied more easily to partially isolated source/drain transistors. The semiconductor device according to this invention can realize the benefits of partially isolated source/drain transistors, such as suppressing the parasitic capacitance of the source/drain junction, reducing source and drain leakage current, etc. Amorphous semiconductor material at the source/drain region is crystallized and then shrinks through the annealing in the solid phase epitaxy (SPE) process, so as to apply tensile stress in the channel direction. Hence, this technique is particularly suitable for example for enhancing carrier mobility in nMOS transistors. Further, as compared to the conventional polycrystalline semiconductors, the resistance of the source/drain region formed is improved.

BRIEF DESCRIPTION OF THE DRAWINGS

The following detailed description of some embodiments will be better understood when read in conjunction with the appended drawings. It should be understood, however, that embodiments are not limited to the precise arrangements and instrumentalities shown. In the drawings, like numerals are used to indicate like elements throughout. Furthermore, other desirable features and characteristics will become apparent from the subsequent detailed description and the appended claims, taken in conjunction with the accompanying drawings and the foregoing technical field and background.

For simplicity and clarity of illustration, the drawing figures illustrate the general manner of construction, and descriptions and details of well-known features and techniques may be omitted to avoid unnecessarily obscuring aspects of the illustrated embodiments. Additionally, elements in the drawings figures are not necessarily drawn to scale. For example, the dimensions of some of the elements or regions in some of the figures may be exaggerated relative to other elements or regions of the same or other figures to help improve understanding of the example embodiments. In the drawings.

DESCRIPTION OF THE EMBODIMENTS

The detailed description set forth below in connection with the appended drawings is intended as a description of embodiment, and is not intended to completely describe all possible embodiments. That is, there is no intention to be bound by any expressed or implied theory presented in the preceding technical field, background, or the following detailed description of example embodiments. It is to be understood that the same or equivalent functions may be accomplished by different embodiments.

The terms "first", "second", and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises, includes, or has a list of elements is not necessarily limited to those elements, but may include other elements not expressly listed or inherent to such process, method, article, or apparatus.

According to the embodiments of this disclosure, for semiconductor devices, such as partially isolated source/drain transistors, instead of employing a polycrystalline semiconductor, such as polycrystalline silicon for the source/drain region, the source/drain region can be formed through a solid phase epitaxy (SPE) process. Therefore, as compared to the conventional strained silicon technique (such as, SiGe epitaxy or SiC epitaxy), it can be applied to partially isolated source/drain transistors more easily. In general, in this application, the solid phase epitaxy may comprise processes such as filling an amorphous semiconductor material in recesses for source/drain region, and forming the source/drain region through a heat treatment such as an annealing treatment, etc. Amorphous semiconductor material at the source/drain region is crystallized and then shrink through the annealing of the solid phase epitaxy (SPE) process, so as to apply tensile stress in the channel direction. Therefore, as compared to the conventional polycrystalline semiconductors, using the process described herein the resistance of the source/drain region formed is be improved.

A method of manufacturing a semiconductor device and the manufactured semiconductor device according to an embodiment of this disclosure will be described below with reference to FIGS. 2-5. For the convenience of description, the description comprises a partially isolated source/drain nMOS transistor as an example.

Figure 1:
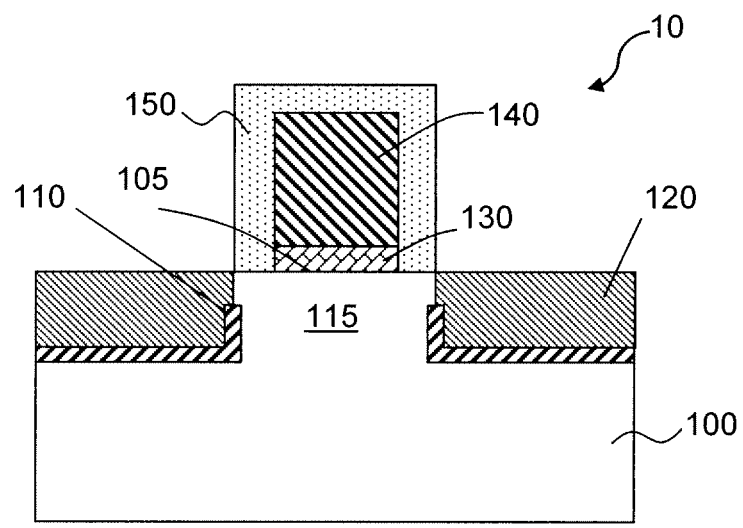
FIG. 1 is a sectional diagram showing a prior art exemplary partially isolated source/drain transistor.
Figure 2:
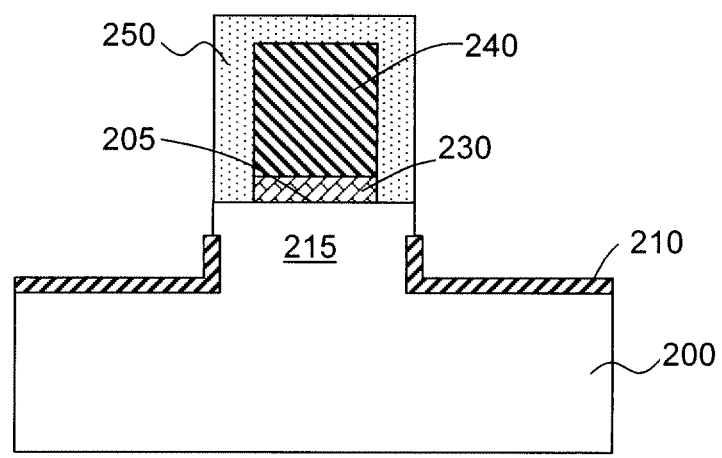
FIG. 2 is a sectional diagram showing a first step in a method of manufacturing an exemplary partially isolated source/drain transistor according to an embodiment of this disclosure.

As shown in FIG. 2, a semiconductor substrate 200 is etched to form one or more recesses for the source/drain region retaining the channel region 215 between the recesses. For example, the semiconductor substrate 200 may be a silicon (Si) substrate.

FIG. 2, shows a gate electrode 240 formed on the semiconductor substrate 200. Specifically, a gate insulating film 230 is formed on a channel region 215 disposed on the semiconductor substrate 200 and a gate electrode 240 is formed on the gate insulating film 230. The gate insulating film 230 can be, for example, an oxide, nitride, oxynitride, nitride oxide or other high dielectric constant (high K) material. The gate electrode 240 can be, for example, a polycrystalline silicon layer. In addition, a gate spacer 250 is further disposed around the gate electrode 240 and gate insulating film 230. The gate spacer 250 can be for example a nitride. Note that the gate spacer 250 is shown as a layer on the top of the opposite sides and on the top of the gate electrode 240. However, those skilled in the art will appreciate that it may comprise sidewalls on the opposite sides of the gate electrode 240 and a hard mask layer on the top of the gate electrode 240.

Then, an isolation layer 210 is formed on the surface of the one or more recess. As shown in FIG. 2, apart of a side surface of the recess adjacent to surface 205 of the semiconductor substrate 200 is exposed from the isolation layer 210, without covering the whole side surface of the recess. As an example, the isolation layer 210 may be an oxide, nitride, oxynitride, or nitride oxide layer.

For example, an oxide layer as the isolation layer 210 can be formed on the surface of the recess through oxidization. Then, the oxide layer is etched to expose the part of the side surface of the recess adjacent to surface 205 of the semiconductor substrate 200. The etching herein may be any appropriate process that is known in the art.

Note that the above description is merely an example of preparing the partially isolated semiconductor structure shown in FIG. 2. There is no limitation on the processes of forming the recess, isolator, gate electrode, and gate insulating film, etc. Also, those skilled in the art may appreciate that this disclosure may be implemented prior to the gate electrode 240 being formed on the semiconductor substrate.

The recess is then filled with an amorphous semiconductor material 220. According to an exemplary embodiment of this disclosure, the recess can be filled through depositing amorphous semiconductor material 220 on the semiconductor substrate 200 and then for example selectively removing the amorphous semiconductor material 220.

Figure 3:
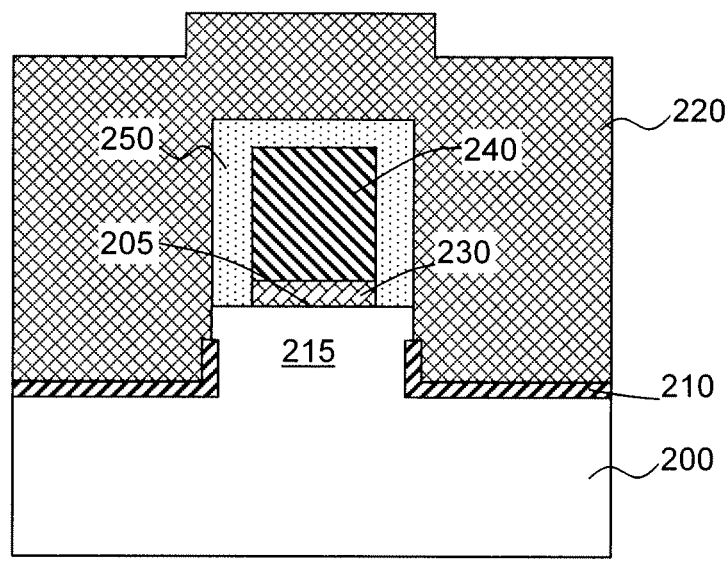
FIG. 3 is a sectional diagram showing a second step in a method of manufacturing an exemplary partially isolated source/drain transistor according to an embodiment of this disclosure.

As shown in FIG. 3, the amorphous semiconductor material 220 can be deposited on the semiconductor substrate 200. The amorphous semiconductor material 220 can be deposited, for example, through techniques that are well known in the art, such as chemical vapor deposition (CVD), plasma enhanced chemical vapor deposition (PECVD), etc.

The amorphous semiconductor material 220 may be as an example, amorphous silicon or amorphous silicon carbide (SiC). Where the amorphous semiconductor material 220 is amorphous SiC, the amorphous SiC can contain carbon of 1-4 volume %.

Figure 4:
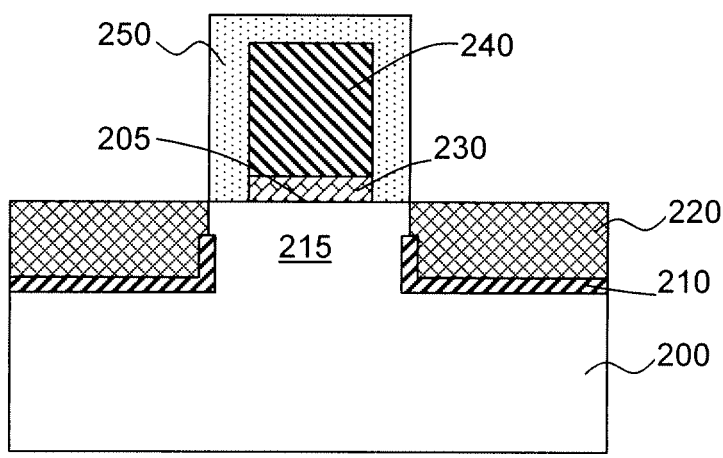
FIG. 4 is a sectional diagram showing a third step in a method of manufacturing an exemplary partially isolated source/drain transistor according to an embodiment of this disclosure.

As shown in FIG. 4, the deposited amorphous semiconductor material 220 is then planarized and etched back such that only the amorphous semiconductor material 220 in the recess remains. The planarization process may be for example, chemical mechanical polishing (CMP).

After filling the recess with the amorphous semiconductor material 220, preferably, a surface treatment such as plasma surface treatment, surface annealing treatment, or the like can be performed on the semiconductor substrate 200, in order to clean and activate the surface of the semiconductor structure shown in FIG. 2, and to facilitate the subsequent deposition of the amorphous semiconductor material 220.

As an example, the surface treatment may be a hydrogen plasma treatment performed with an Rf power of 200 W under a pressure of 2 Torrs at the room temperature for 1-3 mins. Alternatively, the surface treatment may be hydrogen annealing performed in a $H_2$ atmosphere with a flow rate of 20-200 standard liters/min (SLM), under a pressure of 30-760 Torrs and at a temperature of 800° C. for 1-3 mins.

Figure 5:
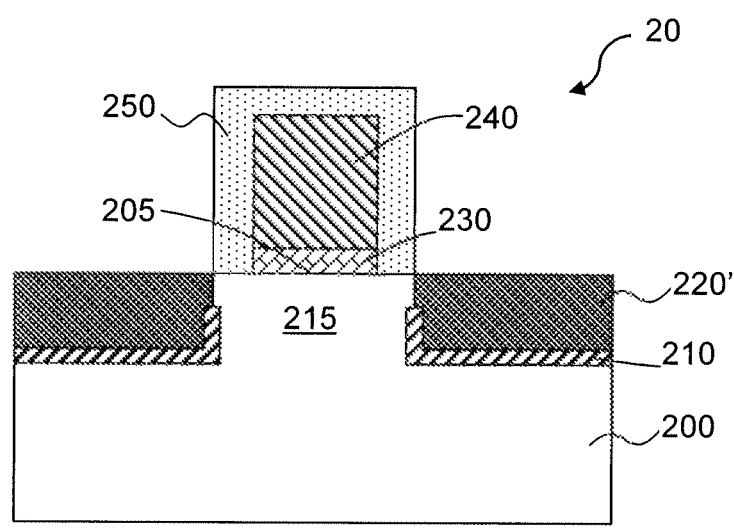
FIG. 5 is a sectional diagram showing a fourth step in a method of manufacturing an exemplary partially isolated source/drain transistor according to an embodiment of this disclosure.

Referring to FIG. 5 after the completion of filling with the amorphous semiconductor material 220, the amorphous semiconductor material 220 is annealed to form source/drain region 220', so as to complete the formation of the semiconductor device 20. For example, the annealing may be performed in a $N_2$ or He atmosphere at 600-750° C. for 2-36 hours. Preferably, the annealing may be performed in a $N_2$ or He atmosphere at 650° C. for 24 hours.

Through the above annealing, the amorphous semiconductor material 220 is crystallized and then shrinks, so as to apply tensile stress in the channel direction. Hence, a process incorporating features of the invention is for example, particularly suitable for enhancing carrier mobility in nMOS transistors. Further, as compared to conventional polycrystalline semiconductors, the resistance of the source/drain region formed according to the method described is improved.

As shown in FIG. 5, the resulted semiconductor device 20 comprises source/drain region 220' on the semiconductor substrate 200. The semiconductor device 20 further comprises an isolation layer 210 below the source/drain region 220' and on a first portion of the side of the source/drain region 220' interfacing with the channel region 215, where the isolation layer is not disposed on a second portion of the side of the source/drain region 220' adjacent to surface 205 of the semiconductor substrate 200.

The method of manufacturing the semiconductor device and the manufactured semiconductor device produced according to this method has been described in detail. The description of some details well known in the art may have been omitted to avoid obscuring the concept of the embodiment of the invention. Those skilled in the art would know how to implement the technical solution disclosed herein based on the above description.

Those skilled in the art will appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner in light of the drawings, specification, and following claims.

What is claimed is:

1. A method of manufacturing a semiconductor device, comprising, in the following order:
   first, etching a semiconductor substrate to form one or more recesses around a channel region, wherein the one or more recesses have a defined depth from a surface of the semiconductor substrate to the bottom of the one or more recesses;
   second, forming a continuous isolation layer on a bottom surface and a side surface of the one or more recesses, wherein a portion of the side surface of the channel region adjacent to the surface of the semiconductor substrate is free of said isolation layer so as to provide said recess with an exposed substrate side wall portion;
   third, completely filling the one or more recesses having the isolation layer on the bottom surface and the side surface thereof, with a layer of an amorphous semiconductor material using a single deposition step, in which the layer of the amorphous semiconductor material overlies and contacts said isolation layer on the bottom surface and the side surface of the one or more recesses, such that the layer of the amorphous semiconductor material has a top surface aligned with the surface of the semiconductor substrate and in contact with the exposed substrate side wall portion;
   fourth, annealing the amorphous semiconductor material to form a source/drain region in contact with the exposed substrate side wall portion, such that tensile stress is applied to the semiconductor device in direction of the channel; and
   wherein the forming of the isolation layer further comprises:
   forming an oxide layer on the surface of the recess using oxidation; and
   etching the oxide layer to expose the portion of the side surface of the channel region adjacent to the surface of the semiconductor substrate.

2. The method of claim 1, further comprising:
   before forming the recess, forming a gate insulating film on the surface of the semiconductor substrate and forming a gate electrode on the gate insulating film.

3. The method of claim 1, wherein filling the recess with an amorphous semiconductor material comprising:
   depositing an amorphous semiconductor material on the semiconductor substrate; and
   selectively removing the amorphous semiconductor material such that only the amorphous semiconductor material in the recess remains.

4. The method of claim 3, wherein selectively removing the amorphous semiconductor material comprises:
   planarizing the deposited amorphous semiconductor material; and
   etching back the amorphous semiconductor material.

5. The method of claim 4, wherein the planarizing comprises chemical mechanical polishing.

6. The method of claim 1, wherein the amorphous semiconductor material comprises amorphous Si.

7. The method of claim 1, wherein the amorphous semiconductor material comprises amorphous SiC.

8. The method of claim 7, wherein the amorphous SiC contains 1-4 volume % carbon.

9. The method of claim 1, wherein the annealing is performed in a $N_2$ or He atmosphere at 600-750° C. for 2-36 hours.

10. The method of claim 1, wherein the annealing is performed in a $N_2$ or He atmosphere at 650° C. for 24 hours.

11. The method of claim 1, wherein before filling the one or more recesses with the amorphous semiconductor material the semiconductor substrate is subjected to a plasma surface treatment.

12. The method of claim 11, wherein the plasma surface treatment is a hydrogen plasma treatment performed with an Rf power of 200 W under a pressure of 2 Torrs at room temperature for 1-3 mins.

13. The method of claim 1, wherein before filling the one or more recesses with the amorphous semiconductor material, a surface annealing treatment is performed on the semiconductor substrate.

14. The method of claim 13, wherein the surface annealing treatment is hydrogen annealing performed in $H_2$ atmosphere with a flow rate of 20-200 SLM, under a pressure of 30-760 Torrs and at a temperature of 800° C. for 1-3 mins.

15. The method of claim 1, wherein the semiconductor device is an nMOS transistor.

16. The method of claim 1, wherein the semiconductor substrate is a Si substrate, and the isolation layer is a layer of silicon oxide, silicon nitride, silicon oxynitride or silicon nitride oxide.

* * * * *